United States Patent [19]

Le Poole et al.

[11] Patent Number: 4,789,780
[45] Date of Patent: Dec. 6, 1988

[54] APPARATUS FOR ENERGY-SELECTIVE VISUALIZATION

[75] Inventors: Jan B. Le Poole, Tucson, Ariz.; Karel D. Van der Mast, Pijnacker, Netherlands

[73] Assignee: U.S. Philips Corporation, New York, N.Y.

[21] Appl. No.: 26,716

[22] Filed: Mar. 17, 1987

[30] Foreign Application Priority Data

Mar. 18, 1986 [NL] Netherlands ............... 8600685

[51] Int. Cl.$^4$ ............................................. H01J 37/00
[52] U.S. Cl. ............................... 250/305; 250/311
[58] Field of Search ............... 250/294, 288, 305, 306, 250/307, 310, 311, 295, 296

[56] References Cited

U.S. PATENT DOCUMENTS 3,909,610  9/1975  Kokubo ..................... 250/305
4,034,220  7/1977  le Gressus et al. ......... 250/305
4,107,526  8/1978  McKinney et al. .......... 250/305

FOREIGN PATENT DOCUMENTS 5442195  3/1979  Japan ..................... 250/305
5673468 11/1982  Japan ..................... 250/305

OTHER PUBLICATIONS

Kuyatt et al., Field Emission Deflection Energy Analysis, Review of Scientific Inst., vol. 43, #1, Jan. 72 pp. 108-111.

Primary Examiner—Carolyn E. Fields
Assistant Examiner—John A. Miller
Attorney, Agent, or Firm—Paul R. Miller

[57] ABSTRACT

An apparatus for energy-selective visualization of a beam of charged particles emerging from an object is equipped with a double-focusing energy analyzer which is provided with a two-dimensional entrance diaphragm. For visualization of both an image and a spectrum, an optical imaging system behind the analyzer is preferably equipped with one or more quadrupole lenses. An illumination system for an object to be examined is preferably equipped with a system for a sequential partial illumination of the object.

13 Claims, 1 Drawing Sheet

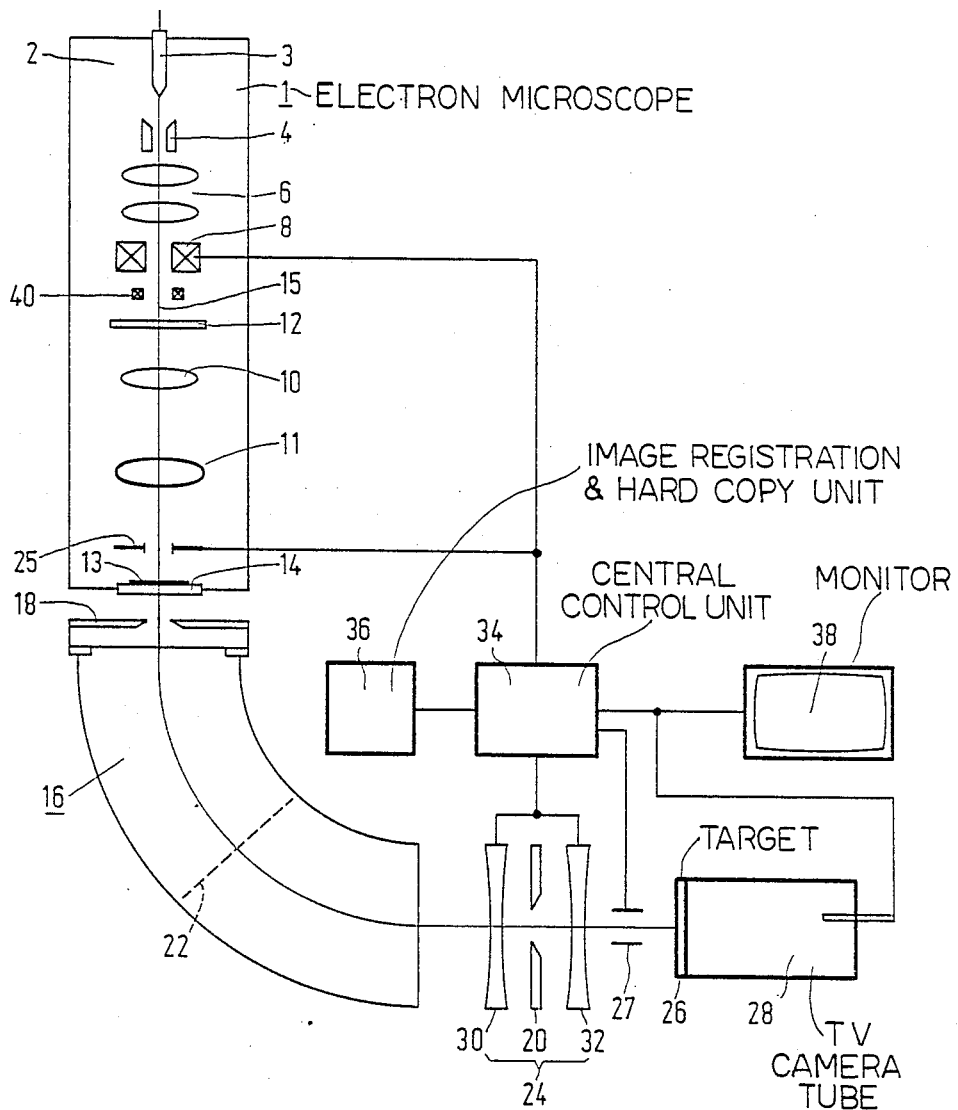

APPARATUS FOR ENERGY-SELECTIVE VISUALIZATION

The invention relates to an apparatus for the formation of energy-selective visualisations of an object by means of a beam of charged particles emerging from the object, which apparatus is equipped with an energy analyser, a beam deflector system with two synchronously controllable beam deflectors positioned on both sides of the analyser, and with a particle detection device.

An apparatus of this kind is known from the Journal Phys. Soc. Japan 17, 1962, pp. 596–570. An apparatus described there for energy-selective visualization of the object irradiated by an electron beam comprises, successively positioned after an imaging lens, a line deflector, an energy analyser with an entrance slit and an exit slit, a cylindrical lens and a second line deflector.

For the visualisation of an object, a line is selected by the first slit diaphragm for the formation of an energy or velocity spectrum of that part of the image that is allowed to pass through by the slit. With the second slit diaphragm a relatively narrow energy band is selected from this and an image is formed from this with the aid of a cylindrical lens. By moving the image of the object transversely across the first slit and shifting the partial spectrum behind the second slit in correlation with this, a visualization of the entire image if the object can be formed for each selected energy band. In an energy selection of this kind the resolution of the energy filter depends on the size of an intermediate image to be formed in the filter. To obtain a high resolution, a relatively small image field is needed, for otherwise excessively large optical errors occur. If for a final visualisation such an intermediate image is visualized on an entrance plane of a detection device, a direct relation occurs between the size of this final visualisation and the resolution in the final image. With a narrow slit for a high energy resolution, therefore, only a small intermediate image can be permitted, or filter errors must be extensively corrected. This can only be done to a limited extent. If a high resolution is required, then the analysis of an entire image field will require a relatively large amount of time. If a larger image is first formed from a smaller visualisation by post-enlargement in order to increase the speed of the analysis, then interference fields often prove so troublesome that the intended effect is not achieved. As a result of these combined effects restrictions are imposed on the possibilites for forming energy-selective visualisations of image fields which are not small.

The object of the invention is to eliminate these restrictions and for this purpose according to the invention an apparatus of the kind mentioned in the preamble is characterised in that the energy analyser comprises a diaphragm, which selects a partial beam from the beam of charged particles, to which is added a two-dimensional beam deflection system.

In an apparatus according to the invention the image for spectral analysis is divided into partial beams, for example, by moving the image in two directions across an entrance diaphgram in front of the analyser and by projecting an image again geometrically correctly on a detection system with a deflection synchronised with this movement.

The images to be analysed for an object can be formed by releasing charged particles, normally electrons from the surface of an object, for example by irradiating this with electromagnetic or corpuscular radiation. Such pictures can also be formed by irradiating a preparation with an electron or ion beam, in which respect as already mentioned the difference in interaction between individual particles of the beam and the preparation results in differences in velocity for the particles behind the preparation.

In a preferred embodiment, the detection device comprises a television camera tube to which a monitor is connected for image reproduction. A spectrum analyser can be connected to the camera tube for spectrum analysis, but a spectrum analyser can also be connected directly for this purpose. With an energy selecting slit which is then widened, it is not the images but the spectrum which is visualised at the detector entrance. For the detection of spectra or images use can also be made of a film camera, with the advantage of the production of a direct hard copy, or of a preferably self-scanning CCD matrix.

For the projection of a spectrum or an image on a detection entrance plane use is made in a preferred embodiment of a quadrupole lens. Such a lens—to be positioned behind or after the analysis filter—can be placed in front of or behind the plane of the exit slit, viewed from the filter. With a quadrupole lens positioned close in front of the plane of the exit slit an enlarged spectrum can be projected on the detection device at a given energisation of the lens. The action of the lens in the dispersion direction is then strongly negative. Varying the energisation then results in a variation in the enlargement of the spectrum. Since the strength of a quadrupole lens in the negative direction can be made much greater than in the positive direction, a marked enlargement of the spectrum can be achieved in this way with a single optical element. A weak positive energisation of the quadrupole lens in the dispersion direction results in a visualization of an enlarged intermediate image of the preparation plane in the filter on an entrance plane of the detection device. Because of the positive lens action this can be achieved with a sharp visualisation in the dispersion direction, while crosswise to the dispersion direction the size of the total beam is relatively small, as a result of which there is therefore a greater depth of focus for that direction and hence a relatively sharp visualisation can be achieved. The enlargement of the image formed in this way is not variable because then the sharpness would be lost. The size of the image can, however, be varied with the electron microscope itself.

With a quadrupole lens positioned close behind or after the exit slit all the required image formations can be achieved merely by varying the energisation in a single direction, and with a positive lens action in the dispersion direction. With a weak energisation a filtered image is achieved, while stronger energisation gives a visualization of the spectrum which can be varied in size. The enlargement of the spectrum is then restricted, however, by the limited strength of the quadrupole lens. Greater flexibility can be obtained by adding one or more extra quadrupole lenses behind the output slit.

A beam scanning device positioned behind or after the filter, permitting another visualisation of the entire object image to be achieved, can form part of the quadrupole lens elements.

Some preferred embodiments in accordance with the invention will be described in further detail below on the basis of the drawing.

BRIEF DESCRIPTION OF THE DRAWING

The only FIGURE in the drawing shows a schematic representation of an energy-selective imaging apparatus according to the invention.

In an apparatus for energy-selective visualisation the drawing shows a schematic representation of an electron microscope 1 incorporating in a housing 2, to be evacuated, a cathode 3, an anode 4, a condenser system 6, a beam deflection system 8 and an objective lens 10. An image of a preparation 12 incorporated in the apparatus is normally formed by means of an end lens 11 on an exit screen 14. A transmission image 13 of a preparation on the exit screen 14 is formed here by an electron beam 15 emitted by the cathode which, after passing the preparation, contains electrons of mutually differing energy, which would also be the case if the beam was completely monochromatic before interacting with the preparation. The difference in energy arises as a result of the difference in the degree of interaction of the individual electrons from the electron beam with the preparation. An energy selection filter 16 is coupled under or after the removable exit screen 14 for energy-selective imaging. Here the filter 16 is a double-focusing, curved filter. The double focusing action can, for example, be obtained by using tilted, conical or bevelled pole pieces or an entrance and/or exit plane of the filter sloping with respect to the direction of the main ray of the electron beam. An example of a double-focusing filter of this kind is described in Optik 71, No. 1, 1985, pages 11 to 14, particularly page 12. The embodiment of the filter is not significant for the invention. The filter 16 is fitted with an entrance diaphragm 18 limiting the image field, positioned optically close to a plane in which an image of the preparation 12 is formed by the end lens 11. At the site of an exit slit 20 a reduced image of the crossover, which is therefore in fact a reduced image of the source, is formed by the filter. An intermediate image of the preparation is formed in a plane—22 of the filter 16, coinciding with its achromatic plane. The energy-resolving power is now largely determined by the transverse dimension of the beam at the site of the plane 22, which dimension is determined by the diaphragm 18. By means of a quadrupole lens 30 or 32 close to the exit slit 20 the achromatic image in the plane 22 is visualised on an entrance target 26 of a television camera tube 28. In this way a relation has been created between the diameter of the image to be detected and the energy-resolving power of the filter. This target 26 may be a semiconductor layer such as a system of semiconductor detection elements acting as the target for particles to be detected. If a narrow energy-selecting slit 20 is used in order to achieve a high energy resolving power, then only an appropriately small image field can also be permitted because of this. If a larger image field is required, it is necessary to correct the filter for errors which occur in this respect, which, as already mentioned, is only possible to a certain extent. For the analysis of a larger total image an x-y deflection system 25 is incorporated after the end lens and an x-y deflection system 27 after the filter. By energising both deflection systems synchronously, the entire object can again be imaged on the target 26, albeit sequentially in partial images. With partial images of, for example, 50×50 pixels, and a line scanning and an image scanning in ten steps each, a total picture in a hundred partial pictures is analysed into 250,000 pixels. It is advantageous for the scanning to take place synchronously with locally occurring interference fields, hence for example with a line frequency of 20 msec, or a whole number times that frequency, as a result of which an image repetition frequency occurs in whole multiples of 0.2 sec. Here consideration can be given as to whether or not to use interlacing in the imaging in order to prevent the occurrence of frame flicker.

In the drawing, a quadrupole lens is incorporated both in front of and behind the exit slit 20. It is, however, possible to use only a single quadrupole lens 30 in front of the filter. With the quadrupole lens 30 a spectrum is projected in enlarged form on the target 26 with a widened slit 20, with a strong negative lens action in the dispersion direction. Variation in the strength of the lens gives a direct variation in the enlargement of the spectrum and hence in the mutual line intervals in this. Since the negative action of a quadrupole lens can be made relatively strong, a large enlargement range can be covered in this way. With a relatively weak lens action in opposite energisation, hence positive in one direction of the dispersion, the achromatic image is visualised sharply on the target 26 from the image field 22 with the quadrupole lens 30. Thanks to the low cross-dimension of the beam in the direction crosswise to the dispersion direction a sharp visualisation can be achieved in both directions. It is now not possible to vary the image size with the quadrupole lens, for then the image sharpness would be disturbed, but provision can be made for this by an earlier image size variation in the system, or possibly by using another quadrupole lens. Quadrupole lenses have the advantage that when imaging no image rotation takes place with varying lens strength, and that they take up little space, are light, and have a strong lens action even at a relatively low energisation.

With a quadrupole lens 32 positioned behind the filter all the visualisations mentioned can be achieved by varying the lens strength within a single mode. With a weak positive energisation in the dispersion direction a filtered picture is formed on the target 26, while stronger energisation in the same direction results in an image of the spectrum on the target which can be varied in size.

For control of the entire apparatus a central control unit 34 has been added to which an image registration unit and a hard copy unit 36, respectively, have been connected here. A monitor 38 has also been incorporated here for image reproduction.

In order to avoid overloading the preparation during partial sequential imaging which applies here, it is advantageous to irradiate momentarily only that part of the preparation of which an image is then formed. With a scanning in the 10×10 steps already mentioned, only about a hundredth part of the preparation is then irradiated each time and the total load on the preparation can therefore be reduced by a factor of 100. A beam-shape scanning system 40 in the illumination system for the preparation can be used for this scanning. After that, a beam with an adapted transverse cross-section is moved over the preparation in the sequence of the above-mentioned steps. This scanning is controlled synchronously with the beam scanning for the energy selection or the visualisation. In an electron beam apparatus equipped with a matrix semiconductor emitter as the electron source it is also possible to use a synchronised activation control of individual emitters or groups of emitters for scanning the preparation.

What is claimed is:

1. An apparatus for forming energy-selective viewing of images of objects comprising
   first means for forming with a beam of charged particles an image of an object,
   image field enlarging means for dividing said image into partial images in two directions, said image field enlarging means including second means for deflecting said beam in two dimensions,
   energy analyzing means for analyzing energy or velocity spectrums of said partial images, said energy analyzing means including entrance diaphragm means for selecting said partial images to be viewed in said two directions, and third means for projecting geometrically correct images from said energy analyzing means,
   fourth means following said energy analyzing means for again deflecting said partial images into said two directions, and
   detection means for detecting and monitoring signals provided from said partial images.

2. An apparatus according to claim 1, wherein said first means includes fifth means for directing electromagnetic radiation into said object to form said beam of charged particles.

3. An apparatus according to claim 1, wherein said first means includes sixth means for irradiating said object with a substantially monochromatic electron beam to form said beam of charged particles.

4. An apparatus according to claim 1, claim 2 or claim 3, wherein said first means includes seventh means for selectively and sequentially illuminating said object to form portions of said object, said image being formed from said portions.

5. An apparatus according to claim 1, claim 2, or claim 3, wherein said detection means includes optical means for imaging both image views and spectrum views of said object.

6. An apparatus according to claim 5, wherein said optical means includes at least one quadrupole lens.

7. An apparatus according to claim 6, wherein at least two quadrupole lenses are provided, wherein one of said at least two quadrupole lenses is disposed between said energy analyzing means and an exit slit, and wherein another of said at least two quadrupole lenses is disposed between said exit slit and said fourth means.

8. An apparatus according to claim 6, wherein said quadrupole lens is disposed between said energy analyzing means and exit slit, and means are provided for negatively energizing said quadrupole lens in a dispersion direction.

9. An apparatus according to claim 6, wherein said quadrupole lens is disposed between said energy analyzing means and an exit slit, and means are provided for positively energizing said quadrupole lens in a dispersion direction.

10. An apparatus according to claim 6, wherein said quadrupole lens includes an integrated structure of a lens and beam-deflection element.

11. An apparatus according to claim 1, claim 2, or claim 3, wherein said detection means includes a television camera tube.

12. An apparatus according to claim 1, claim 2, or claim 3, wherein said detection means includes camera means for monitoring spectrum analyses.

13. An apparatus according to claim 1, claim 2, or claim 3, wherein said detection means includes semiconductor means for detecting said partial images, said semiconductor means acting as a target for said partial images.

* * * * *